(12) United States Patent
Burton et al.

(10) Patent No.: US 12,248,011 B2
(45) Date of Patent: Mar. 11, 2025

(54) ELECTROMAGNETIC FIELD RECEIVER

(71) Applicant: BRITISH TELECOMMUNICATIONS PUBLIC LIMITED COMPANY, London (GB)

(72) Inventors: Fraser Burton, London (GB); Marco Menchetti, London (GB); Liam Bussey, London (GB); Amelia Winterburn, London (GB)

(73) Assignee: British Telecommunications Public Limited Company (GB)

( * ) Notice: Subject to any disclaimer, the term of this patent is extended or adjusted under 35 U.S.C. 154(b) by 0 days.

(21) Appl. No.: 18/554,534

(22) PCT Filed: Mar. 4, 2022

(86) PCT No.: PCT/EP2022/055580
§ 371 (c)(1),
(2) Date: Oct. 9, 2023

(87) PCT Pub. No.: WO2022/214252
PCT Pub. Date: Oct. 13, 2022

(65) Prior Publication Data
US 2024/0094275 A1    Mar. 21, 2024

(30) Foreign Application Priority Data

Apr. 9, 2021 (GB) ...................... 2105096

(51) Int. Cl.
*G01R 29/08* (2006.01)
(52) U.S. Cl.
CPC ................. *G01R 29/0885* (2013.01)
(58) Field of Classification Search
CPC ............ G01R 29/0892; G01R 29/0885; G01R 29/3326

(Continued)

(56) References Cited

U.S. PATENT DOCUMENTS

| 9,970,973 | B2 | 5/2018 | Anderson et al. |
| 10,763,966 | B1 | 9/2020 | Deb et al. |

(Continued)

FOREIGN PATENT DOCUMENTS

| CN | 103616568 A | 3/2014 |
| CN | 105068025 A | 11/2015 |

(Continued)

OTHER PUBLICATIONS

"International Preliminary Report on Patentability received for PCT Patent Application No. PCT/EP2022/055578, mailed on Aug. 23, 2023", pp. 1-8.

(Continued)

*Primary Examiner* — Daniel Munoz
(74) *Attorney, Agent, or Firm* — EIP US LLP (57) ABSTRACT

This disclosure provides an electromagnetic field detector, and a method of operating the electromagnetic field detector in a wireless telecommunications network, the electromagnetic field detector including a first optical transmitter, a second optical transmitter, and a transmission medium, wherein the first optical transmitter is configured to transmit a probe signal at a probe frequency and the second optical transmitter is configured to transmit a coupling signal at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency (EIT) effect such that an incident electromagnetic field at the transmission medium causes a detectable change in the probe signal.

9 Claims, 8 Drawing Sheets

(58) Field of Classification Search
USPC .......................................................... 343/702
See application file for complete search history.

(56) References Cited

U.S. PATENT DOCUMENTS

| | | | |
|---|---|---|---|
| 2009/0289629 | A1 | 11/2009 | Tuchman |
| 2011/0234219 | A1* | 9/2011 | Boehi .................... G01R 33/10 |
| | | | 324/260 |
| 2016/0363617 | A1 | 12/2016 | Anderson et al. |
| 2020/0136727 | A1 | 4/2020 | Graceffo et al. |
| 2020/0295838 | A1 | 9/2020 | Gordon et al. |

FOREIGN PATENT DOCUMENTS

| | | |
|---|---|---|
| CN | 106802373 A | 6/2017 |
| CN | 108604038 A | 9/2018 |
| CN | 109001137 A | 12/2018 |
| CN | 110401492 A | 11/2019 |
| CN | 112415284 A | 2/2021 |
| GB | 2597260 A | 1/2022 |
| WO | 2021078438 A1 | 4/2021 |
| WO | 2022214251 A1 | 10/2022 |

OTHER PUBLICATIONS

"International Search Report and Written Opinion received for PCT Patent Application No. PCT/EP2022/055578, mailed on Jul. 19, 2022", pp. 1-22.
"International Search Report and Written Opinion received for PCT Patent Application No. PCT/EP2022/055580, mailed on Jun. 24, 2022", pp. 1-10.
"Office Action received for Great Britain Patent Application No. 2105096.8, mailed on Dec. 17, 2021", pp. 1-4.
"Office Action received for Great Britain Patent Application No. 2105101.6, mailed on Aug. 1, 2022", pp. 1-6.
"Office Action received for Great Britain Patent Application No. 2105101.6, mailed on Jan. 10, 2022", pp. 1-13.
Anderson, et al. , "Rydberg Atoms for Radio-Frequency Communications and Sensing: Atomic Receivers for Pulsed RF Field and Phase Detection" , Cornell University Library, Available Online at <https://arxiv.org/abs/1910.07970v1> , Oct. 18, 2019 , pp. 1-10.
Hollowa, et al. , "Detecting and Receiving Phase-Modulated Signals With a Rydberg Atom-Based Receiver" , IEEE Antennas and Wireless Propagation Letters, vol. 18, No. 9, Sep. 9, 2019, pp. 1853-1857.
Holloway, et al. , "Electric Field Metrology For Si Traceability: Systematic Measurement Uncertainties In Electromagnetically Induced Transparency In Atomic Vapor" , Journal of Applied Physics, vol. 121, 233106 , 2017, pp. 1-9.
Kumar, et al., "Atom-Based Sensing of Weak Radio Frequency Electric Fields Using Homodyne Readout" , Scientific Reports, vol. 7, No. 1, Available Online at <https://www.nature.com/articles/srep42981.pdf> , Feb. 20, 2017 , 10 pages.
Li, et al., "Transient Properties of an Electromagnetically Induced Transparency in Three-level Atoms", Optics Letters, vol. 20, No. 13 , Jul. 1, 1995 , pp. 1489-1491.
Meyer, et al., "Digital Communication with Rydberg Atoms & Amplitude-Modulated Microwave Fields" , Cornell University Library, Available Online at <https://aps.arxiv.org/abs/1803.03545v2> , Oct. 29, 2018 , pp. 1-10.
Otto, et al., "Bandwidth Increase Through Distributed Atomic Receivers in a Rydberg Vapour Cell", Cornell University Library, Available online at <https://aps.arxiv.org/abs/2102.05285v1> , Dec. 5, 2021 , pp. 1-9.
Robinson, et al., "Determining the Angle-of-Arrival of an Radio-Frequency Source with a Rydberg Atom-Based Sensor" , Cornell University Library, Available Online at <https://arxiv.org/abs/2101.12071>, Jan. 29, 2021 , pp. 1-5.
Song, et al., "The Credibility of Rydberg Atom Based Digital Communication Over a Continuously Tunable Radio-Frequency Carrier" , Cornell University Library, Available Online at <https://arxiv.org/abs/1808.10839>, Sep. 5, 2018, pp. 1-5.
Souza, et al., "EIT-Related Phenomena and Their Mechanical Analogs" , Cornell University Library, Available Online at <https://arxiv.org/abs/1408.1024v4> , Jul. 14, 2015, pp. 1-20.
Zou, et al., "Atomic Receiver by Utilizing Multiple Radio-Frequency Coupling at Rydberg States of Rubidium" , Applied Sciences, vol. 10, No. 4 , 2020, pp. 1-8.
"Chinese Office Action for Application for No. 202280026871.3, dated Feb. 5, 2024", 7 pgs.
"Chinese Office Action issued in 202280027185.8, dated Mar. 5, 2024".
Yang , et al., "Electromagnetically induced transparency of Rydberg atoms in modulated laser fields", Acta Physica Sinica, vol. 65, No. 10 (Abstract Only), 2016, 7 pgs.
Lan , "A Multiplexed Quantum Memory", Optics Express, vol. 17, No. 16, Aug. 3, 2009, pp. 13639-13645.
Lvovsky , "Optical Quantum Memory", Available at: arXiv:1002.4659v3, Apr. 16, 2010, pp. 1-15.
Zhang , "Realization of a Programmable Multipurpose Photonic Quantum Memory with Over-Thousand Qubit Manipulations", Physical Reviews, vol. 14, Apr. 25, 2024, pp. 021018-1-021018-18.

\* cited by examiner

ELECTROMAGNETIC FIELD RECEIVER

PRIORITY CLAIM

The present application is a National Phase entry of PCT Application No. PCT/EP2022/055580, filed Mar. 4, 2022, which claims priority from GB Patent Application No. 2105096.8, filed Apr. 9, 2021, each of which is hereby fully incorporated herein by reference.

TECHNICAL FIELD

The present disclosure relates to an electromagnetic field detector. In particular, this disclosure relates to a Radio Frequency (RF) detector.

BACKGROUND

Conventional RF detectors, such as a dipole antenna, utilize metallic conductors in which electrons move along the conductor in response to an incident RF electric field to produce a small current. In addition to merely detecting the RF signal, an RF receiver may be created by converting this current (e.g. utilizing electronic circuits, mixers, amplifiers and digitizers) into a demodulated, amplified signal.

In many applications it is desirable to reduce the size of the RF receiver. However, conventional RF receivers based on metallic conductors are limited in size as the relationship between sensitivity, frequency and conductor length means that the RF receiver will not perform adequately below a certain size for a given application. An electrically small antenna is one that is operated at a frequency below its natural resonance, but these are limited by the Chu limit that will set the minimum size for any antenna used at a given frequency. A further limitation for conventional RF receivers is that the ability to sense weak RF signals is dependent on the receiver's gain, which is determined by the design of the antenna. Accordingly, the performance of a conventional antenna is restricted in size, bandwidth and sensitivity.

A new form of RF receiver is based on a Rydberg atom. A Rydberg atom is an atom with one or more electrons excited to a very high principal quantum number. These Rydberg atoms have several useful properties, such as very large dipole moments and long decay periods. These properties can be exploited to create an RF receiver that may receive and demodulate Amplitude-Modulated (AM), Frequency-Modulated (FM) and Phase Modulated (PM) RF electric fields over very large frequency ranges (e.g. from hundreds of MHz to 1 THz).

Figure 1:
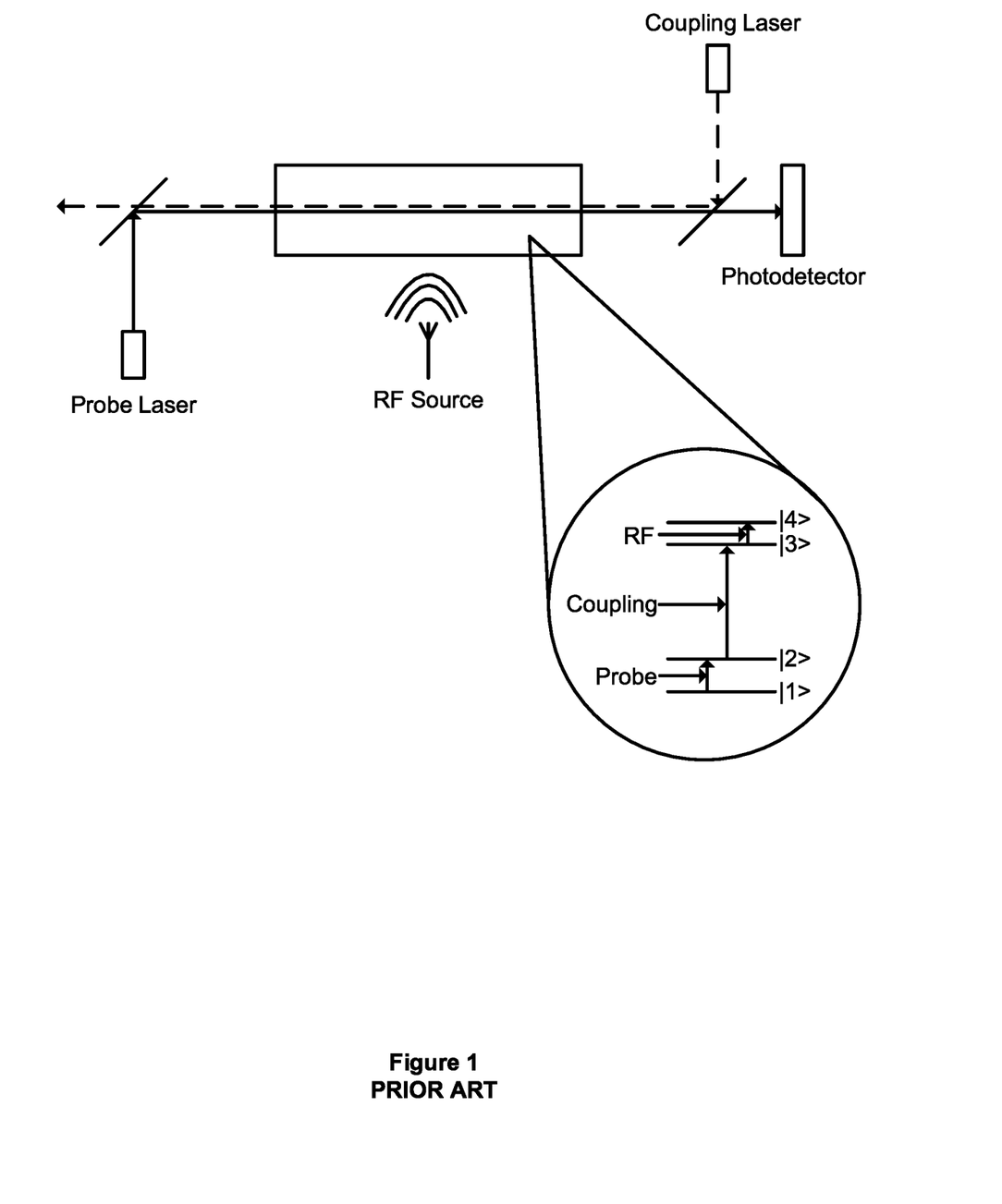
FIG. 1 is a schematic diagram of a conventional Rydberg-atom based electromagnetic field detector.

An example Rydberg-atom based RF receiver is shown in FIG. 1 and operates as follows. An atomic medium is provided which, in this example, is a glass cell filled with a low density vapor of alkali atoms (such as Rubidium-85). Each Rubidium-85 atom has a number of electron states, including the ground state ($|1>$) and a plurality of excited states. The outer electron of the Rubidium-85 atom may be excited (e.g. by absorbing a photon of a particular wavelength) from the ground state ($|1>$) to an excited state. The electron may then decay from the excited state to a lower excited state (that is, an excited state at a lower energy level) or to the ground state ($|1>$). However, some of these transitions are not allowed as they are dipole forbidden.

In the RF receiver, a first laser (known as a "probe" laser) is passed through the atomic medium at a first wavelength which corresponds to the energy required to elevate the Rubidium-85 atom's outer electron from its ground state ($|1>$) to a first excited state ($|2>$). The probe laser is illustrated by a solid arrowed line. A second laser (known as a "coupling" laser) is also passed through the atomic medium in an opposing direction at a relatively large power level (compared to the probe laser) and at a second wavelength which corresponds to the energy required to elevate the Rubidium-85 atom's outer electron from the first excited state ($|2>$) to a Rydberg state ($|3>$). The coupling laser is illustrated by a dashed arrowed line. The transition from the Rydberg state ($|3>$) to the ground state ($|1>$) is forbidden so that the ground state ($|1>$) becomes depopulated and so fewer atoms can absorb the probe laser operating at the first wavelength. Accordingly, the atomic medium becomes more transparent to the probe laser such that there is an increase in transmission of the probe laser, which is observable at an optical detector. This phenomenon is known as Electromagnetically Induced Transparency (EIT) and the received signal is known as the EIT signal. Specifically, the above description is of a ladder scheme EIT effect, but the skilled person would understand that the EIT effect may be realized through alternative electron transitions, such as the Vee and Lambda schemes.

Once the atomic medium has become transparent to the probe laser, then a further physical effect can be exploited to detect RF electric fields. As the Rubidium-85 atom's outer electron is much further away from the atomic nucleus when in the Rydberg state compared to the ground state, a large dipole moment is created and it becomes responsive to incident RF electric fields. An incident RF electric field may cause a further transition of an electron from the Rydberg state to an adjacent Rydberg state. If the transition from the adjacent Rydberg state to the ground state is not forbidden, then electrons may subsequently drop to the ground state so that the atomic medium becomes less transparent to the probe laser, causing a drop in amplitude of the EIT signal. This drop in amplitude of the EIT signal is directly proportional to the incident RF electric field's amplitude, thus creating a Rydberg-atom based AM RF receiver. Rydberg-atom based RF receivers have also been shown to detect frequency modulated and phase modulated RF fields. Regardless of the modulation scheme used, the Rydberg atom based RF detector may be configured to detect RF fields of a specific frequency by selecting a particular second wavelength of the coupling laser so that the electrons of the atomic medium are elevated to a particular Rydberg state. This Rydberg state is selected so that photons at the specific frequency to be detected will elevate electrons from this Rydberg state to its adjacent Rydberg state, creating a detectable change in the EIT signal that may be observed at the optical detector.

SUMMARY

According to a first aspect of the disclosure, there is provided a method of operating an electromagnetic field detector in a wireless telecommunications network, the electromagnetic field detector including a first optical transmitter, a second optical transmitter, and a transmission medium, wherein the first optical transmitter is configured to transmit a probe signal at a probe frequency and the second optical transmitter is configured to transmit a coupling signal at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency, EIT, effect such that an incident electromagnetic field at the transmission medium causes a detectable change in the probe signal, the method comprising: transmitting the probe signal and coupling signal within a plurality of interaction regions of the transmission medium such that each interaction region of the plurality of interaction regions switches between a first condition and a second condition, in which: in the first condition of each interaction region, the probe and coupling signals are transmitted within that interaction region, the second condition of each interaction region exists for a time period for which an effect of the coupling signal on the electrons of the transmission medium persists after a switch from the first condition to the second condition, and, and an intensity of the coupling signal is such that: $\Omega_c^2 < \Gamma_1 \Gamma_2$ in which $\Omega_c$ is a Rabi frequency of the coupling signal, $\Gamma_1$ is the transition rate out of the first excited state of the transmission medium, and $\Gamma_2$ is the transition rate out of the predetermined excited state of the transmission medium.

Aa power value and/or cross-sectional area of the coupling laser may be controlled so that the intensity of the coupling signal is such that $\Omega_c^2 < \Gamma_1 \Gamma_2$.

According to a second aspect of the disclosure, there is provided a computer program comprising instructions which, when the program is executed by a computer, cause the computer to carry out the first aspect of the disclosure. The computer program may be stored on a computer readable carrier medium.

According to a third aspect of the disclosure, there is provided an electromagnetic field detector for a wireless telecommunications network, the electromagnetic field detector comprising: a transmission medium; an optical receiver; a first optical transmitter configured to transmit a probe signal at a probe frequency; a second optical transmitter configured to transmit a coupling signal at a coupling frequency, wherein the probe frequency and coupling frequency are set to excite electrons of the transmission medium to a predetermined excited state so as to induce an Electromagnetic Induced Transparency, EIT, effect in the transmission medium such that an incident electromagnetic field at the transmission medium causes a detectable change in the probe signal at the optical receiver; and a controller configured to control the probe laser and coupling laser so as to transmit the probe signal and coupling signal within a plurality of interaction regions of the transmission medium such that each interaction region of the plurality of interaction regions switches between a first state and a second state, in which: in the first state of each interaction region, the probe and coupling signals are transmitted within that interaction region, the second condition of each interaction region exists for a time period for which an effect of the coupling signal on the electrons of the transmission medium persists after a switch from the first condition to the second condition, and an intensity of the coupling signal is such that: $\Omega_c^2 < \Gamma_1 \Gamma_2$ in which $\Omega_c$ is a Rabi frequency of the coupling signal, $\Gamma_1$ is the transition rate out of the first excited state of the transmission medium, and $\Gamma_2$ is the transition rate out of the predetermined excited state of the transmission medium.

The controller may be configured to control a power value and/or cross-sectional area of the coupling laser so that the intensity of the coupling signal is such that $\Omega_c^2 < \Gamma_1 \Gamma_2$.

Each interaction region of the plurality of interaction regions may be a region of a vapor cell.

The plurality of interaction regions may span from a first side of the vapor cell to a second side of the vapor cell such that a first interaction region of the plurality of interaction regions is situated towards the first side of the vapor cell relative to a second interaction region of the plurality of interaction regions and the second interaction region is situated towards the second side of the vapor cell relative to the first interaction region, and the controller is further configured to iteratively, 1) transmit the probe and coupling signals such that the first interaction region is in the first condition and such that the second interaction region is in the second condition, and 2) transmit the probe and coupling signals such that the first interaction region is in the second condition and such that the second interaction region is in the first condition.

Each interaction region of the plurality of interaction region may be an optical fiber core.

BRIEF DESCRIPTION OF THE FIGURES

In order that the present disclosure may be better understood, embodiments thereof will now be described, by way of example only, with reference to the accompanying drawings in which.

DETAILED DESCRIPTION OF EMBODIMENTS

Embodiments of the present disclosure provide a Rydberg-atom based electromagnetic field receiver in which overlapping probe and coupling lasers interact with a set of Rubidium-85 atoms only after a particular time period has elapsed since that set of Rubidium-85 atoms' preceding interaction with the overlapping probe and coupling lasers. It is shown, below, that such a receiver is able to respond to a change in state (that is, from a first state in which an electromagnetic signal is incident at the receiver to a second state in which there is no electromagnetic signal incident at the receiver, or vice versa) more quickly than prior art Rydberg-atom based electromagnetic receivers, thereby allowing higher data rate communications.

Figure 2:
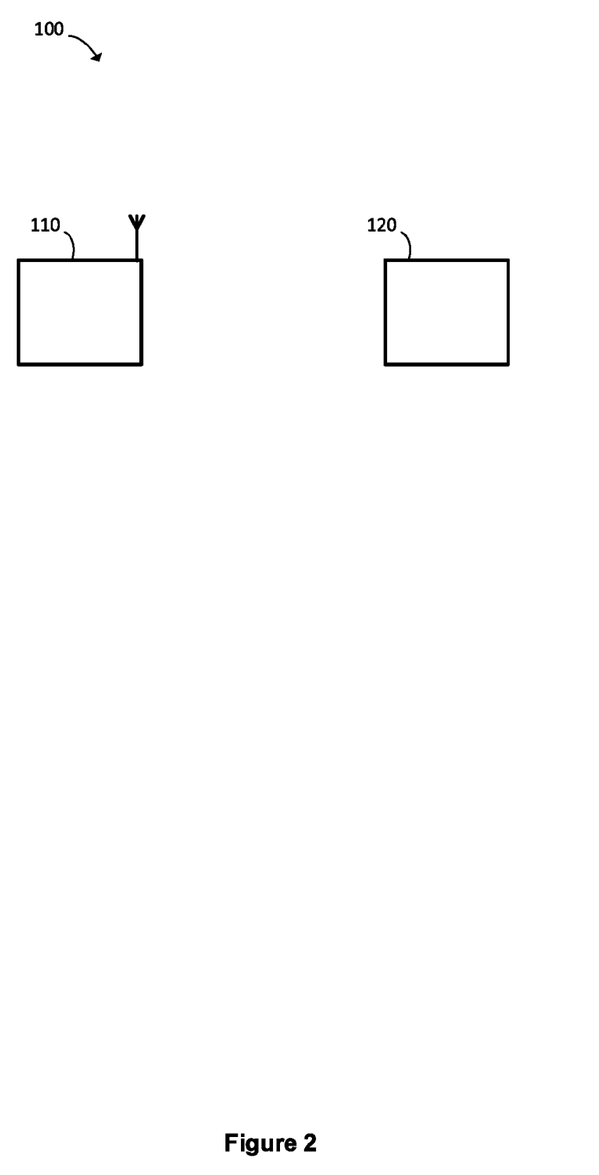
FIG. 2 is a schematic diagram of a first embodiment of a wireless telecommunications network of the present disclosure.
Figure 3:
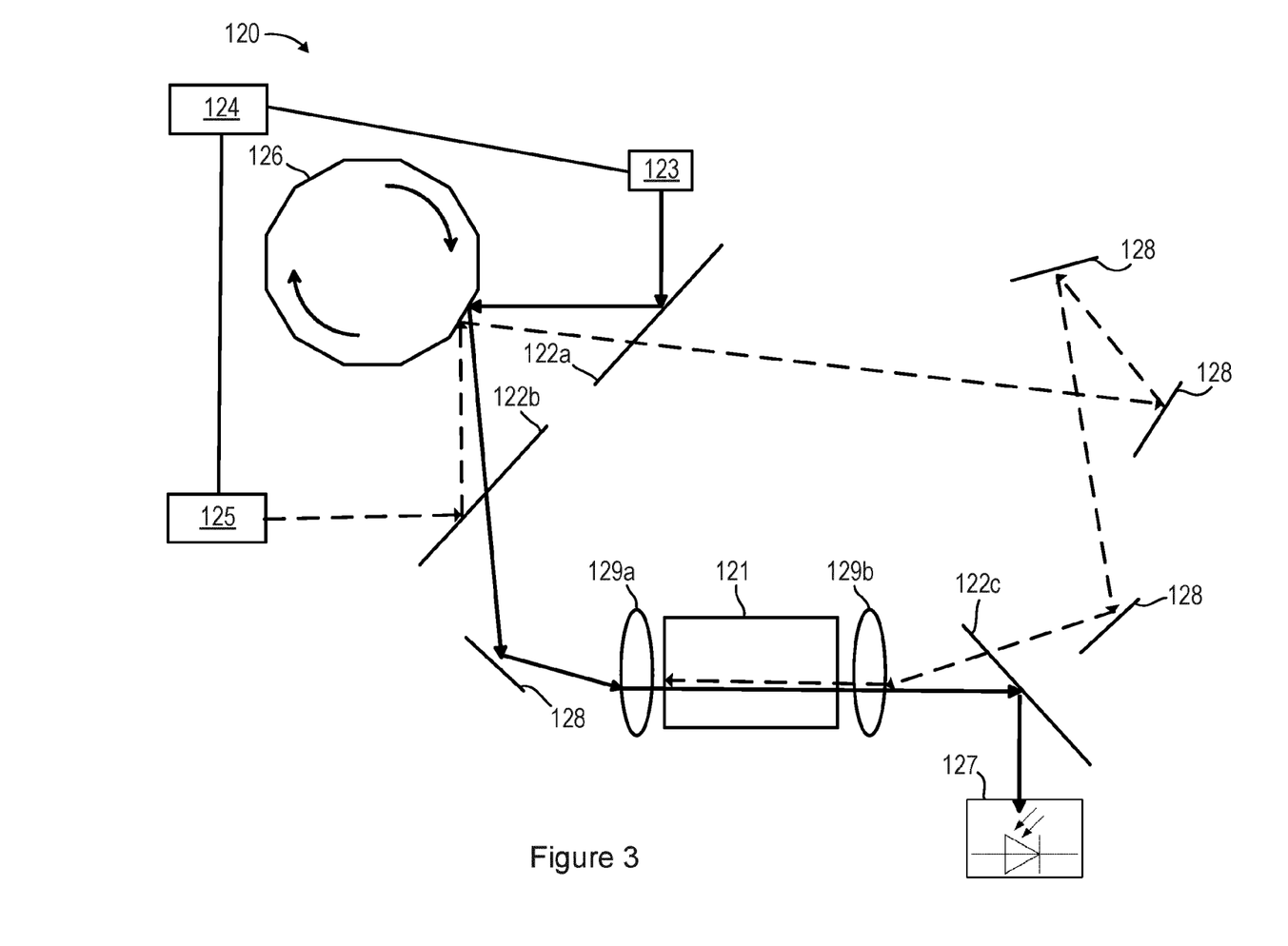
FIG. 3 is a schematic diagram of a Radio Frequency (RF) receiver of the network of FIG. 2.

A first embodiment of a wireless telecommunications network 100 of the present disclosure will now be described. As shown in FIG. 2, the wireless telecommunications network 100 includes a first wireless transmitter 110 and a Radio-Frequency (RF) receiver 120. The first wireless transmitter 110 is configured to transmit wireless signals at a frequency of 2.8 GHz. FIG. 3 illustrates the RF receiver 120 in more detail. The RF receiver 120 is a Rydberg-atom based RF receiver and includes a vapor cell 121, a first dichroic mirror 122a, a second dichroic mirror 122b, a third dichroic mirror 122c, a probe laser 123, a coupling laser 125, a rotating mirror 126, a photodetector 127, a set of mirrors 128, a first lens 129a and a second lens 129b. The vapor cell 121 contains a vapor of alkali metal (in this embodiment, Rubidium-85).

In this embodiment, the probe laser 123 produces a probe signal (illustrated as a solid arrowed line) that is reflected off the first dichroic mirror 122a, the rotating mirror 126, and a mirror of the set of mirrors 128. The probe signal is then focused by the first lens 129a so as to pass through the vapor cell 121. Following passage of the vapor cell 121, the probe signal is passes through the second lens 129b, is reflected off the third dichroic mirror 122c and enters the photodetector 127. The coupling laser 125 produces a coupling signal (illustrated as a dashed arrowed line) that is reflected off the second dichroic mirror 122b, the rotating mirror 126, and several mirrors of the set of mirrors 128. The coupling signal is then focused by the second lens 129b so as to pass though the vapor cell 121. The probe signal and coupling signal are overlapping and counter-propagating through the vapor cell 121. The coupling signal may terminate at a filter (not shown) following passage of the vapor cell 121.

The RF receiver 120 also has a controller 124 for controlling a frequency of the probe signal (i.e. to adjust and/or stabilize the frequency of the probe signal), for controlling a frequency of the coupling signal (i.e. to adjust and/or stabilize the frequency of the coupling signal), for controlling an intensity of the probe laser 123 (i.e. the transmission power and/or cross-sectional area of the probe laser 123), and for controlling an intensity of the coupling laser 125 (i.e. the transmission power and/or cross-sectional area of the coupling laser 125).

The RF receiver 120 may be configured so as to detect a wireless signal incident upon the vapor cell 121. This is achieved by configuring the frequency of the probe signal to correlate with the transition of an electron of a Rubidium-85 atom from a ground state to a first excited state, and by configuring the frequency of the coupling signal to correlate with the transition of an electron of a Rubidium-85 atom from the first excited state to a predetermined Rydberg state. The predetermined Rydberg state is selected (based on the specific frequencies of the probe and coupling signals) so that a wireless signal of a particular frequency incident upon the vapor cell 121 excites electrons from the predetermined Rydberg state to another Rydberg state, causing a detectable change in the Electromagnetically Induced Transparency (EIT) signal at the photodetector 127. In this example, the controller 124 configures the probe laser 123 and coupling laser 125 so that the vapor cell 121 detects wireless signals at a frequency of 2.8 GHz. Thus, in this example, the probe signal and coupling signal are selected so as to excite electrons to a first predetermined Rydberg state having the $90^{th}$ principal quantum number energy state (i.e. the probe signal has a wavelength of 780 nm and the coupling signal has a wavelength of 479.380 nm) such that wireless signals transmitted by the wireless transmitter 110 at 2.8 GHz that pass through the vapor cell 121 will excite electrons from the predetermined Rydberg state to another Rydberg state, causing an EIT signal in the monitored probe signal at the photodetector 127.

The EIT signal at the photodetector 127 may be processed to demodulate data from the incoming signal. That is, a change in the EIT signal from a calibrated baseline above a certain threshold may be considered a first bit (e.g. a bit of value '1'), whereas no change in the EIT signal from the calibrated baseline (or a change less than the threshold) may be considered a second bit (e.g. a bit of value '0'). The data rate of the RF detector 127 is thus limited based on the response time for the EIT signal to change between these states. This response time is discussed in more detail below.

In this embodiment, the rotating mirror 126 is configured as a regular dodecagon that rotates about its central axis. As the rotating mirror 126 rotates, the angle of reflection of the probe signal and the angle of reflection of the coupling signal changes. The rotating mirror 126 is configured (together with the first and second dichroic mirrors 122a, 122b, the set of mirrors 128 and the first and second lens 129a, 129b) such that, as these angles of reflection change, the probe signal and coupling signal pass through a different region of the vapor cell 121 (and remain overlapping and counter-propagating). In other words, the interaction region (in which the overlapping probe and coupling signals interact with the Rubidium-85 atoms) changes as the rotating mirror 126 rotates. Furthermore, these components of the RF detector 120 are configured so that, as the point of incidence of the probe signal and coupling signal moves from one vertex of the rotating mirror 126 to an adjacent vertex of the rotating mirror 126, the interaction region of the vapor cell 121 changes from a first side of the vapor cell 121 to an opposing side of the vapor cell 121. Subsequently, as the rotating mirror 126 rotates further such that the probe signal and coupling signal are incident on the adjacent edge of the rotating mirror 126, then the interaction region of the vapor cell 121 switches back to the first side of the vapor cell 121.

The RF detector 120 of this first embodiment therefore differs from prior art Rydberg-atom based RF detectors in that, in the prior art, only a single region of the vapor cell interacted with the probe and coupling lasers whilst all other regions of the vapor cell did not interact with the probe and coupling lasers. Therefore, substantially the same set of Rubidium-85 atoms (being those in that single region of the vapor cell) interacted with the probe and coupling lasers. In this first embodiment, each region of the vapor cell 121 has two conditions, 1) a non-interacting condition in which the probe and coupling signals do not pass through that region, and 2) an interacting condition in which the probe and coupling signals do pass through that region and interact with the Rubidium-85 atoms that are within that region. In this embodiment, as the overlapping probe and coupling lasers continually move through the vapor cell 121 (from a first side to the opposing side) and move back to the first side, then each region iterates through being in the non-interacting condition and in the interacting condition. There is a time period between each region being in an interacting condition of a first iteration and being in an interacting condition in a second iteration (equal to the time that region is in the intervening non-interacting condition). This time period allows electrons of the Rubidium-85 atoms in that region to decay to the ground state (that is, the state of these electrons of the Rubidium-85 atoms when in the non-interacting condition), before being re-excited again (once they enter the interacting condition in the subsequent second iteration and interact again with the probe and coupling signals). It is shown, below, that this arrangement reduces the response time of the EIT signal compared to the prior art Rydberg-atom based RF detector.

Figure 4:
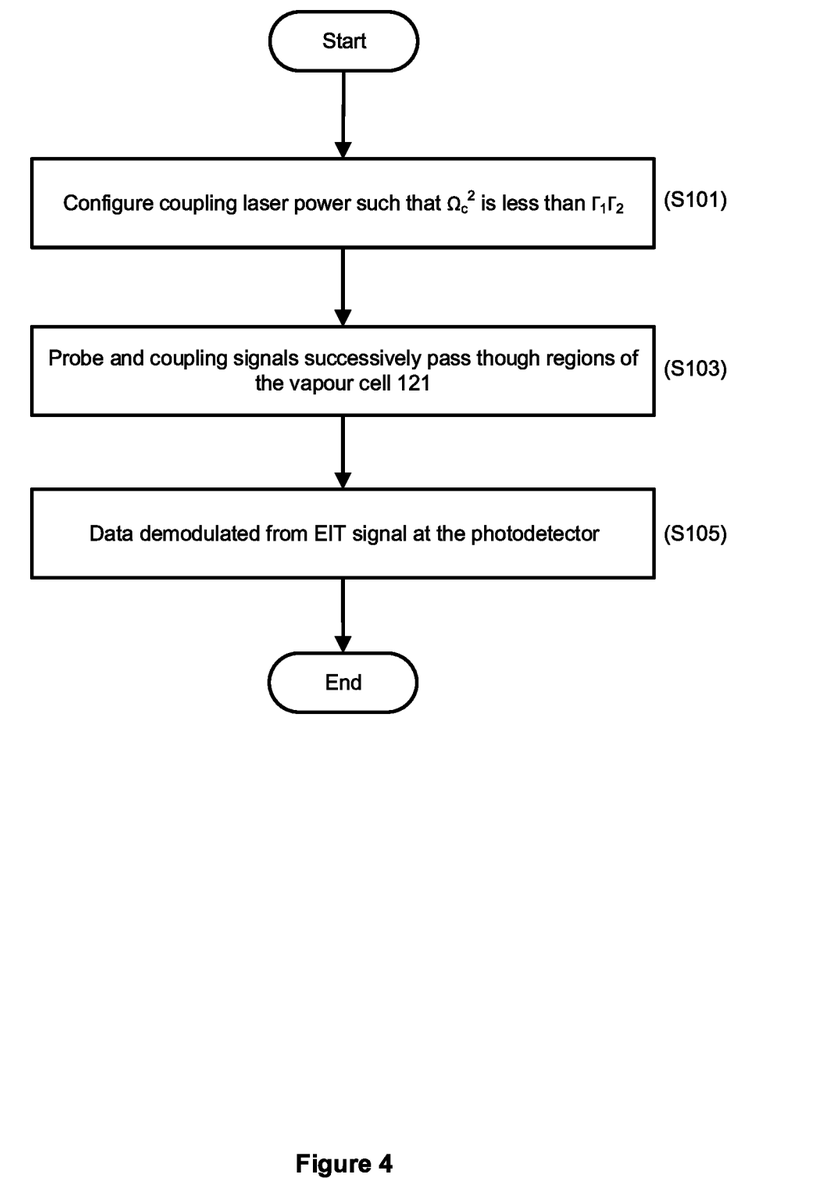
FIG. 4 is a flow diagram illustrating a first embodiment of a method of the present disclosure.

A first embodiment of a method of the present disclosure will now be described with reference to FIG. 4. This first embodiment relates to the RF detector 120 of the first embodiment, described above. In S101, a coupling laser 125 power value is configured so that $\Omega_c^2$ (in which $\Omega_c$ is the Rabi frequency of the coupling signal, which is the product of the E-field amplitude and the transition dipole moment divided by the reduced Planck constant) is less than $\Gamma_1\Gamma_2$ (in which $\Gamma_1$ and $\Gamma_2$ are the transition rates out of the first excited state and predetermined Rydberg state respectively). In S103, the RF detector 120 is operated so that the probe and coupling signals successively pass through regions of the vapor cell 121, wherein successive passages of the probe and coupling signals through a single region of the vapor cell 121 only occur after a time period equal to or greater than the time period for the Rubidium-85 atoms in that region to return to the ground state. In S105, data is demodulated from the EIT signal at the photodetector 127. This data may then be processed (locally or by another entity).

The following description is a theoretical analysis of the RF detector 120 of the first embodiment to facilitate understanding of its technical benefit of achieving faster EIT signal response times (and thus greater data rates) compared to the conventional Rydberg-atom based RF receiver. This theoretical analysis assumes a ladder-configuration for realizing the EIT effect, but the skilled person will understand that other configurations (such as Vee and Lambda) are equally applicable. This theoretical analysis also assumes that an intensity of the probe laser 123 is relatively weak (compared to the intensity of the coupling laser 125), such that the absorbance of the probe signal at the photodetector 127 is not a function of the intensity of the probe laser 123. The absorbance, A, of the atomic medium of Rubidium-85 atoms in the vapor cell 121 is described by the imaginary part of the complex electric susceptibility as $$A = (2N|\wp_{12}|^2/\varepsilon_0 \hbar)(\Gamma_2\Gamma_3 + \Omega_r^2)/[\Gamma_1(\Gamma_2\Gamma_3 + \Omega_r^2) + \Gamma_3\Omega_c^2] \quad (1)$$

In which:
- N is the number of atoms engaged in the interaction,
- $|\wp_{12}|$ is the transition dipole moment of the first transition (between the ground state and the first excited state),
- $\varepsilon_0$ is the electric permittivity of free space,
- $\hbar$ is the reduced Planck constant,
- $\Gamma_1, \Gamma_2$ and $\Gamma_3$ are the transition rates out of the first excited state, the predetermined Rydberg state, and the adjacent Rydberg state respectively, and
- $\Omega_r$ and $\Omega_c$ are the Rabi frequencies of the RF and coupling signals, which is the product of the E-field amplitude and the relevant transition dipole moment divided by the reduced Planck constant.

This steady-state response can be theoretically reproduced using a mechanical model of three coupled masses connected by springs, where the first mass has the charge of an electron and is subject to a driving force due to the probe laser of amplitude $E_p$ and angular frequency $\omega_p$. This mechanical model can be described by the following coupled differential equations:

$$(d^2x_1/dt^2) + \Gamma_1(dx_1/dt) + \omega_p^2 x_1 - \omega_p \Omega_c^2 x_2 = -(2E_p \omega|\wp_{12}|^2/e\hbar)\exp(i\omega_p t) \quad (2)$$

$$(d^2x_2/dt^2) + \Gamma_2(dx_2/dt) - \omega_p x_1 + \omega_p^2 x_2 - = 0 \quad (3)$$

$$\omega_p \Omega_r^2 x_3 (d^2x_3/dt^2) + \Gamma_3(dx_3/dt) - \omega_p x_2 + \omega_p^2 x_3 = 0 \quad (4)$$

In which:
- Subscripts 1, 2 and 3 represent a particular mass,
- $x_i$ is a displacement of mass i from its equilibrium position, and
- $\omega_p$ is the angular frequency of probe laser, Assuming all three masses move as $x_i = X_i \exp(i\omega t)$, in which $X_i$ is the maximum displacement of mass i, then equations 2, 3 and 4 can be solved for $X_1$ as:

$$X_1 = i(2E_p|\wp_{12}|^2/e\hbar)(\Gamma_2\Gamma_3 + \Omega_r^2)/\{\Gamma_1\Gamma_2\Gamma_3 + \Omega_r^2)X_1 + \Gamma_3\Omega_c^2\} \quad (5)$$

Electric susceptibility, $\chi$, is a dimensionless quantity of a medium (that is, the medium of Rubidium-85 atoms in the vapor cell 121, in the first embodiment above) which is used to relate the electric polarization P to the electric field E as:

$$P = NeX_1 = \varepsilon_0 \chi E_p \quad (6)$$

Therefore, $$A = \text{Im}(\chi) = \text{Im}(NeX_1/\varepsilon_0 E_p) = (2N|\wp_{12}|^2/\varepsilon_0 \hbar)(\Gamma_2\Gamma_3 + \Omega_r^2)/\{\Gamma_1\Gamma_2\Gamma_3 + \Omega_r^2)X_1 + \Gamma_3\Omega_c^2\} \quad (7)$$

Which is the same result as equation 1.

The following analysis illustrates the response time in two separate scenarios for a Rydberg-atom based RF receiver which undergoes a change in the EIT signal from a first state to a second state.

In a first scenario, the probe laser 123 and coupling laser 125 of the RF detector 120 are powered such that the probe signal and coupling signal pass through a region of the vapor cell. For the purposes of this first scenario only, the rotating mirror 126 is not rotating such that the probe signal and coupling signal pass through a single region of the vapor cell 121. In other words, that region of the vapor cell 121 is in the interacting condition (such that Rubidium-85 atoms within that region interact with the probe and coupling signals) and does not switch to the non-interacting condition, and all other regions of the vapor cell are in the non-interacting condition and do not switch to the interacting condition. In this configuration, the Rubidium-85 atoms within the region of the vapor cell 121 that are in the interacting condition are constantly excited by both the probe and coupling signals. These atoms therefore experience the EIT effect such that their electrons are elevated to a predetermined Rydberg state (having an adjacent Rydberg state whereby the energy difference between the predetermined Rydberg state and another Rydberg state is equal to the energy of the wireless signal to be detected).

This first scenario can be analyzed, using the mechanical model described above, to determine a response time for the EIT signal when there is a change in presence of a wireless signal at the vapor cell 121 (i.e. from a state where there is no wireless signal incident at the vapor cell 121 to a state where there is a wireless signal incident at the vapor cell 121, or from a state where there is a wireless signal incident at the vapor cell 121 to a state where there is no wireless signal incident at the vapor cell 121).

At time t<0, a wireless signal is incident at the vapor cell 121. The probe signal may therefore be absorbed (as electrons move from the predetermined Rydberg state to the adjacent Rydberg state and then to the ground state). Assuming the wireless signal is incident at the vapor cell 121 for sufficient time for the system to reach a steady state, it can be shown that:

$$x_1 = X_1(\Omega_r^2, \Omega_c^2)\exp(i\omega_p t) \quad (8)$$

$$x_2 = X_2(\Omega_r^2, \Omega_c^2)\exp(i\omega_p t) \quad (9)$$

$$x_3 = X_3(\Omega_r^2, \Omega_c^2)\exp(i\omega_p t) \quad (10)$$

At time t=0, there is no wireless signal incident at the vapor cell 121. The probe signal is therefore absorbed less as there is no longer a path for electrons to move from the predetermined Rydberg state to the ground state (that is, the step from the predetermined Rydberg state to the adjacent Rydberg state is no longer available). The EIT effect is therefore restored. At time t>0, it can be shown that:

$$x_1 = X_1(0, \Omega_c^2)\exp(i\omega_p t) + D_1 \exp(-\alpha t) \quad (11)$$

$$x_2 = X_2(0, \Omega_c^2)\exp(i\omega_p t) + D_2 \exp(-\alpha t) \quad (12)$$

$$x_3 = X_3(0, \Omega_c^2)\exp(i\omega_p t) + D_3 \exp(-\alpha t) \quad (13)$$

In which $D_i$ represents a magnitude of the response of mass i to the incident wireless signal, which has a complex decay rate u. At time t=0, it can be shown that:

$$D_1 = X_1(\Omega_r^2, \Omega_c^2) - X_1(0, \Omega_c^2) \quad (14)$$

$$D_2 = X_2(\Omega_r^2, \Omega_c^2) - X_2(0, \Omega_c^2) \quad (15)$$

$$D_3 = X_3(\Omega_r^2, \Omega_c^2) - X_3(0, \Omega_c^2) \quad (16)$$

Applying equation 2 and separating out the transient behavior, it can be shown that:

$$(\alpha^2 - \Gamma_1 \alpha + \omega_p^2) D_1 - \omega_p \Omega_c^2 D_2 = 0 \quad (17)$$

It can be further shown that:

$$i\Gamma_1 D_1 = \Omega_c^2 D_2 \quad (18)$$

Thus, the only physical solution for the complex decay term is:

$$\alpha = \Gamma_1 + i\omega_p \quad (19)$$

This analysis shows that, when both the probe signal and coupling signal are constantly interacting with Rubidium-85 atoms in the region of the vapor cell 121, the transparency of the probe signal (and thus the EIT signal) will react to a change in presence of a wireless signal at the vapor cell 121 with a dynamic response having a decay rate of $\exp(-\Gamma_1 t)$ with a sinusoidal variety of $2\omega_p$. The response time of the EIT signal in this first scenario is therefore limited only by $\Gamma_1$, the transition rate out of the first excited state of the Rubidium-85 atom.

A second scenario will now be analyzed. In this second scenario, the probe signal is present in all regions of the vapor cell 121 whilst the coupling signal successively passes through each region of the vapor cell 121. As the intensity of the probe laser is relatively weak (compared to the coupling signal), such that absorbance of the probe signal at the photodetector is not a function of the intensity of the probe laser, then there is no difference in the response of the EIT signal between such a configuration and that of the RF detector 120 described above (in which the probe signal also successively passes through each region of the vapor cell 121 at the same time as the coupling laser 125). This second scenario can also be analyzed, using the mechanical model described above, to determine a response time for the EIT signal when there is a change in presence of a wireless signal at the vapor cell 121 (i.e. from a state where there is no wireless signal incident at the vapor cell 121 to a state where is a wireless signal incident at the vapor cell 121, or from a state where there is a wireless signal incident at the vapor cell 121 to a state where there is no wireless signal incident at the vapor cell 121).

At time t<0, the probe laser 123 is powered, the coupling laser 125 is unpowered, and a wireless signal is incident at the vapor cell 121. The probe signal therefore interacts with Rubidium-85 atoms in the region of the vapor cell 121 but there is no coupling signal in the region of the vapor cell 121 for the Rubidium-85 atoms to interact with. Electrons of the Rubidum-85 atoms in this region are therefore excited from the ground state to the first excited state but are not excited to the predetermined Rydberg state. There are therefore no Rubidium-85 atoms for the wireless signal to interact with. As the transition from the first excited state to the ground state is permitted (i.e. not forbidden), then electrons oscillate between the ground state and the first excited state, absorbing the probe signal such that the vapor cell 121 is opaque to the probe signal. Accordingly, at time t<0, it can be shown that:

$$x_1 = X_1(\Omega_r^2, 0)\exp(i\omega_p t) \quad (20)$$

$$x_2 = X_2(\Omega_r^2, 0)\exp(i\omega_p t) \quad (21)$$

$$x_3 = X_3(\Omega_r^2, 0)\exp(i\omega_p t) \quad (22)$$

In a second state of this second scenario (at time t=0), the probe laser 123 and coupling laser 125 are powered and a wireless signal is incident at the vapor cell 121. Thus, both the probe and coupling signals pass through the region of the vapor cell 121. Accordingly, the Rubidium-85 atoms of vapor cell 121 may interact with both the probe and coupling signals so that the EIT effect is restored. At time t>0, it can be shown that:

$$x_1 = X_1(\Omega_r^2, \Omega_c^2)\exp(i\omega_p t) + C_1 \exp(-\alpha t) \quad (23)$$

$$x_2 = X_2(\Omega_r^2, \Omega_c^2)\exp(i\omega_p t) + C_2 \exp(-\alpha t) \quad (24)$$

$$x_3 = X_3(\Omega_r^2, \Omega_c^2)\exp(i\omega_p t) + C_3 \exp(-\alpha t) \quad (25)$$

In which $C_i$ represents a magnitude of the response of mass i to the incident wireless signal, which has a complex decay rate u. At time t=0, it can be shown that:

$$C_1 = X_1(\Omega_r^2, 0) - X_1(\Omega_r^2, \Omega_c^2) \quad (26)$$

$$C_2 = X_2(\Omega_r^2, 0) - X_2(\Omega_r^2, \Omega_c^2) \quad (27)$$

$$C_3 = X_3(\Omega_r^2, 0) - X_3(\Omega_r^2, \Omega_c^2) \quad (28)$$

Applying equation 2 and separating out the transient behavior, it can be shown that:

$$(\alpha^2 - \Gamma_1 \alpha + \omega p^2) C_1 - \omega_p \Omega_c^2 C_2 = 0 \quad (29)$$

It can be further shown that:

$$\Gamma_3 C_1 = i(\Gamma_2 \Gamma_3 + \Omega_r^2) C_2 \quad (30)$$

So, $$(\alpha^2 - \Gamma_1 \alpha + \omega_p^2) i(\Gamma_2 \Gamma_3 + \Omega_r^2) - \Gamma_3 \omega_p \Omega_c^2 = 0 \quad (31)$$

Considering just the real part $\beta$ of $\alpha = \beta + i\gamma$, which represents the exponential decay of the dynamic response, it can be shown that:

$$2\beta = \Gamma_1 + (\Gamma_1^2 \Gamma_2 / \Omega_c^2) \quad (32)$$

Accordingly, when both the probe signal and wireless signal are present in the region of the vapor cell 121, the transparency of the probe signal (and thus the EIT signal) will react to a change in intensity of the coupling signal in the region of the vapor cell 121 with a dynamic response that is a function of the coupling power (in addition to the transition rates out of the first excited state and predetermined Rydberg state). This property can be exploited so as to reduce the response time of the EIT signal. That is, by configuring the RF detector so that each region transitions from a non-interacting condition (which has not been subject to the coupling signal for at least sufficient time for electrons of the Rubidum-85 atoms of that region to reach a steady-state in this non-interacting condition) to an interacting condition (where there is a coupling signal), and using a coupling power value so that $\Omega_c^2$ is less than $\Gamma_1\Gamma_2$, then the response time of the EIT signal will be less than the response time had the region been constantly excited by the coupling signal.

Figure 5:
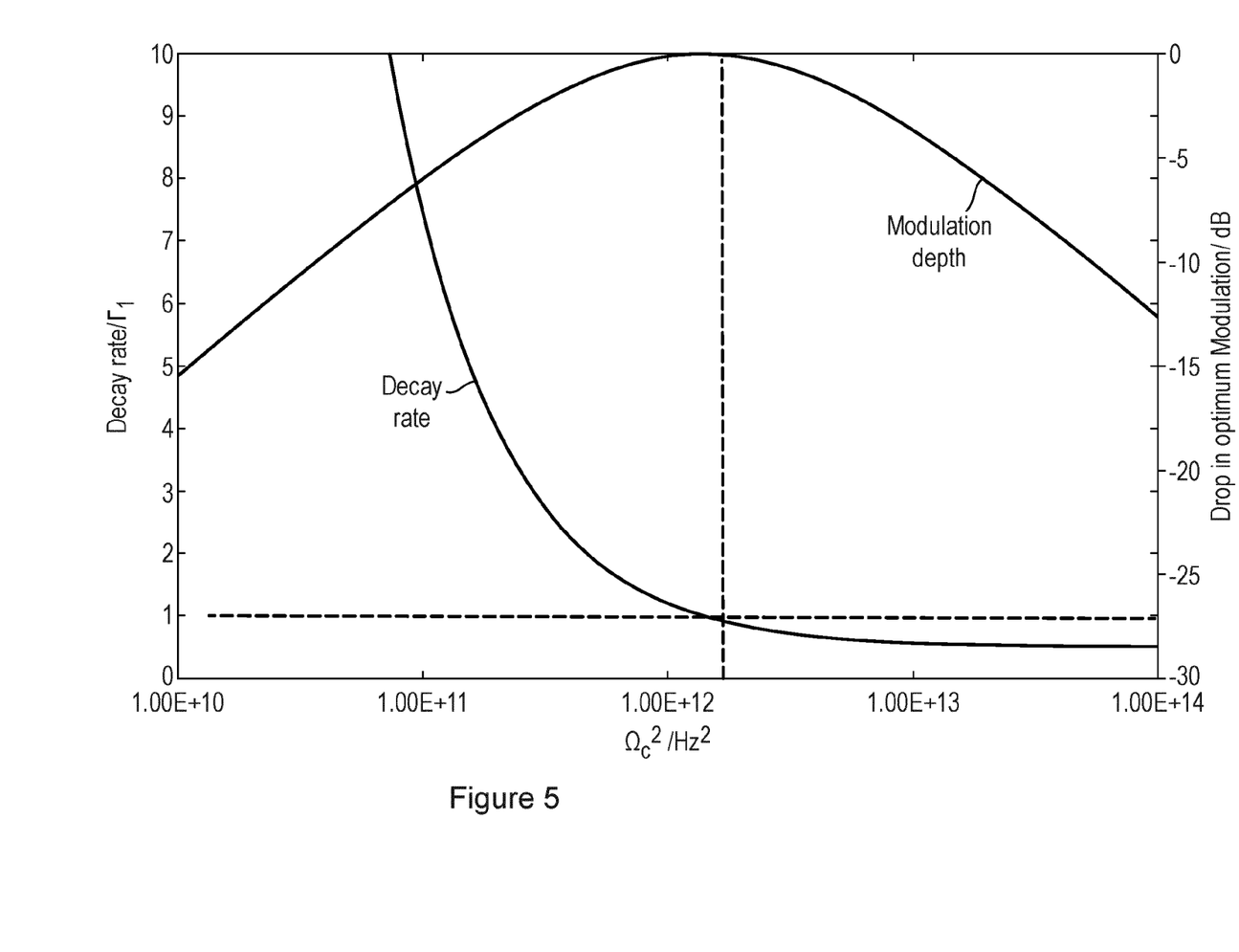
FIG. 5 is a graph illustrating a coupling laser power value against modulation depth.

It is further noted that the modulation depth (that is, the difference in magnitude of the EIT signal when there is a wireless signal incident at the vapor cell 121 and when there is no wireless signal incident at the vapor cell 121) will be sub-optimal. That is, modulation depth is optimized when $\Omega_c^2$ equals $\Gamma_1\Gamma_2$. Therefore, in selecting a coupling laser power value such that $\Omega_c^2$ is less than $\Gamma_1\Gamma_2$, the modulation depth is necessarily sub-optimal. FIG. 5 is a graph of the relationship between modulation depth and the decay rate (in units of Fi). This graph that the modulation depth is maximized when $\Omega_c^2$ equals $\Gamma_1\Gamma_2$ (represented by the vertical dashed line), which corresponds with a decay rate of $\Gamma_1$ (represented by the horizontal dashed line). As the value of $\Omega_c^2$ decreases from $\Gamma_1\Gamma_2$ (i.e. to the left hand side of the vertical dashed line), the decay rate increases. Thus, although the modulation depth is compromised, the decay rate (and therefore the EIT signal's response time) is improved. The coupling laser power value must therefore be selected such that $\Omega_c^2$ is less than $\Gamma_1\Gamma_2$ but the modulation depth on receipt of a wireless signal is greater than a background noise (which will be based on the strength of the wireless signal at the RF detector 120 and the background noise level).

Figure 6:
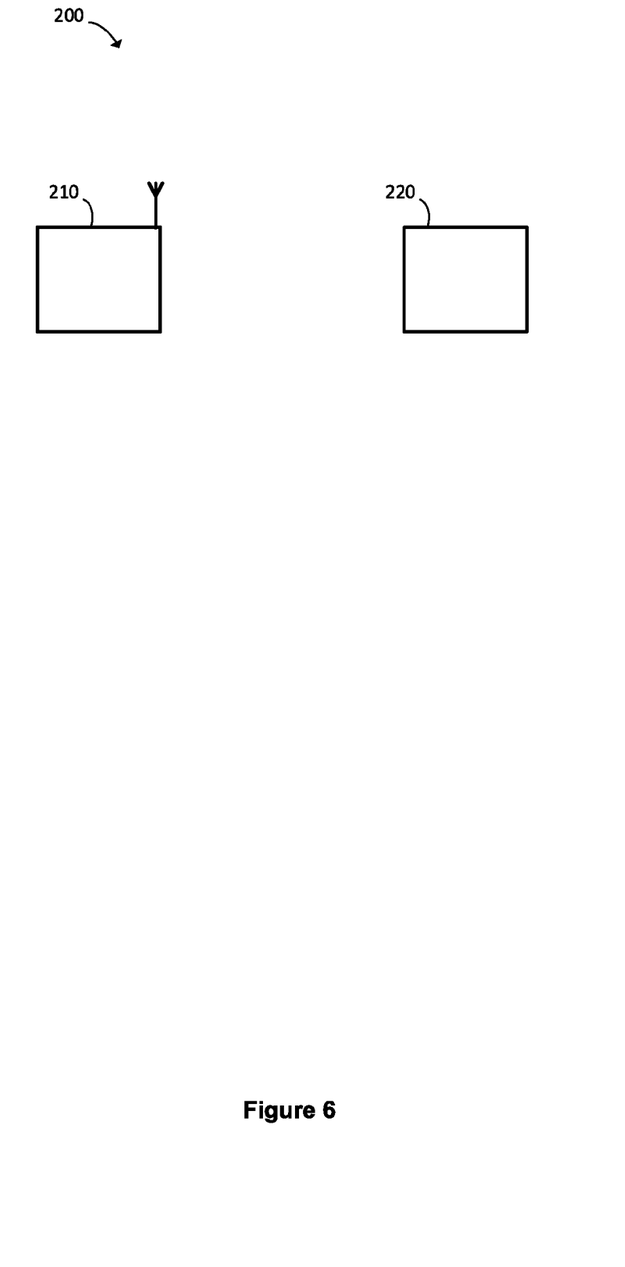
FIG. 6 is a schematic diagram of a second embodiment of a wireless telecommunications network of the present disclosure.
Figure 7:
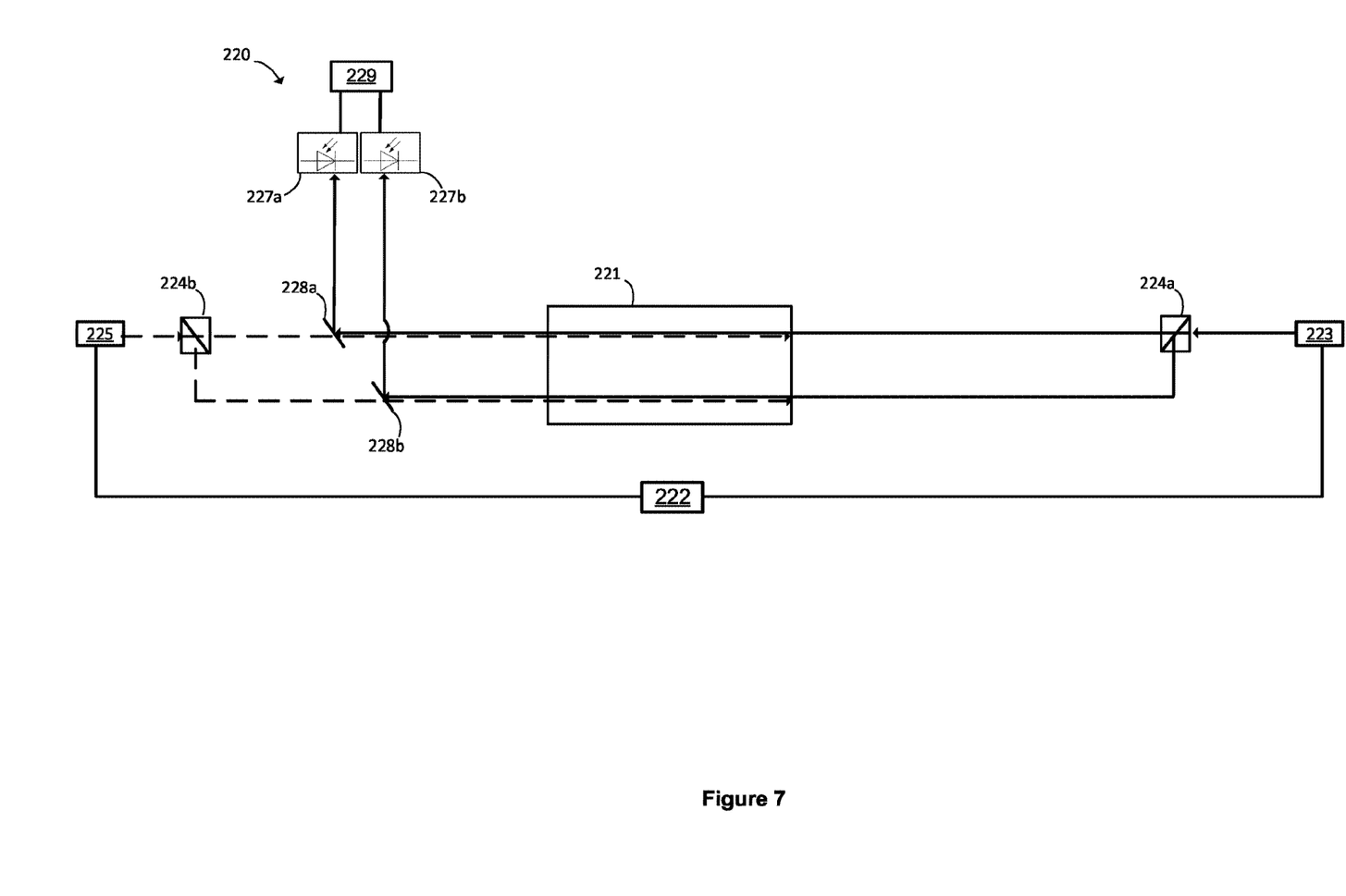
FIG. 7 is a schematic diagram of a RF receiver of the network of FIG. 6.

A second embodiment of a wireless telecommunications network 200 will now be described with reference to FIG. 6. The wireless telecommunications network 200 includes a wireless transmitter 210 and an RF receiver 220. In this embodiment, the wireless transmitter 210 is configured to transmit wireless signals at a frequency of 2.8 GHz. As shown in FIG. 7, the RF receiver 220 is a Rydberg-atom based RF receiver and includes a vapor cell 221, a probe laser 223, a first beam splitter 224a, a second beam splitter 224b, a coupling laser 225, a first photodetector 227a, a second photodetector 227b, a first dichroic mirror 228a and a second dichroic mirror 228b. The RF receiver 220 also includes a processor 229 for processing the received signals of the first and second photodetectors 227a, 227b. The vapor cell 221 contains a vapor of alkali metal (in this embodiment, Rubidium-85).

The RF receiver 220 also has a controller 222 for controlling a frequency of the probe signal (i.e. to adjust and/or stabilize the frequency of the probe signal), for controlling a frequency of the coupling signal (i.e. to adjust and/or stabilize the frequency of the coupling signal), for controlling an intensity of the probe laser 223 (i.e. the transmission power and/or cross-sectional area of the probe laser 223), and for controlling an intensity of the coupling laser 225 (i.e. the transmission power and/or cross-sectional area of the coupling laser 225).

The RF receiver 220 may be configured so as to detect a wireless signal incident upon the vapor cell 221. This is achieved by configuring the probe laser 223 of the RF receiver 220 to transmit a probe signal (illustrated by the solid arrowed line) in a first path that passes through a first region of the vapor cell 221 to excite electrons of the Rubidium-85 atoms of the first region of the vapor cell 221 (in which the first path is created by splitting the probe signal at the first beam splitter 224a), by configuring the probe laser 223 of the RF receiver 220 to transmit a probe signal in a second path that passes through a second region to excite electrons of the Rubidium-85 atoms of the second region of the vapor cell 221 (in which the second path is also created by splitting the probe signal at the first beam splitter 224a), by configuring the coupling laser 225 of the RF receiver 220 to transmit a coupling signal (illustrated by the dashed arrowed line) in a first path that passes through the first region of vapor cell 221 (counter-propagating and overlapping the first path of the probe signal) to excite electrons of the Rubidium-85 atoms of the first region of the vapor cell 221 (in which the first path of the coupling signal is created by splitting the coupling signal at the second beam splitter 224b), and by configuring the coupling laser 225 of the RF receiver 220 to transmit a coupling signal in a second path that passes through the second region of vapor cell 221 (counter-propagating and overlapping the second path of the probe signal) to excite electrons of the Rubidium-85 atoms of the second region of the vapor cell 221 (in which the second path of the coupling signal is also created by splitting the coupling signal at the second beam splitter 224b). Following passage of the first region, the first path of the probe signal is directed towards the first photodetector 227a by the first dichroic mirror 228a and, following passage of the second region, the second path of the probe signal is directed towards the second photodetector 227b by the second dichroic mirror 228b. The frequency of the probe signal is set to correlate with the transition of an electron of a Rubidium-85 atom from a ground state to a first excited state, and the frequency of the coupling signal is set to correlate with the transition of an electron of a Rubidium-85 atom from the first excited state to a predetermined Rydberg state. The predetermined Rydberg state is selected (based on the specific frequencies of the probe and coupling signals) so that a wireless signal of a particular frequency incident upon the first or second region of the vapor cell 221 excites electrons from the predetermined Rydberg state to another Rydberg state, causing a detectable change in the EIT signal at the first or second photodetector 227a, 227b respectively.

The RF receiver 220 is therefore configured to receive of a plurality of spatially-multiplexed data streams. In this embodiment, communications are further multiplexed in the time domain to enable communication of a plurality of time-and-space multiplexed data streams. Accordingly, the first wireless transmitter 210 and RF receiver 220 are further configured for time-division multiplexing by communicating according to a time frame structure in which a first data stream is communicated during a first subset of timeslots of the time frame structure and a second data stream is communicated during a second subset of timeslots of the time frame structure. The RF receiver 220 may therefore be configured so that the processor 229 receives and demultiplexes signals at the first photodetector 227a according to the time frame structure so that a first data stream is demultiplexed as data received during each timeslot of the first set of timeslots of the time frame structure and receives and demultiplexes signals at the second photodetector 227b according to the time frame structure so that a second data stream is demultiplexed as data received during each timeslot of the second set of timeslots of the time frame structure.

In this example, the controller 222 configures the probe laser 223 and coupling laser 225 so that the first and second regions detect wireless signals at a frequency of 2.8 GHz. Thus, in this example, the probe signal and coupling signal are selected so as to excite electrons to a predetermined Rydberg state having the $90^{th}$ principal quantum number energy state (i.e. the probe signal has a wavelength of 780 nm and the coupling signal has a wavelength of 479.380 nm) such that wireless signals transmitted by the wireless transmitter 210 at 2.8 GHz that pass through the first or second region of the vapor cell 221 will excite electrons from the predetermined Rydberg state to an adjacent Rydberg state, causing an EIT signal in the monitored probe signal at the first or second photodetector 227a, 227b.

The RF detector 220 of this second embodiment therefore implements space-and-time division multiplexing in which each spatial region is configured to detect a wireless signal of the same frequency. This may be achieved by directing the coupling signal to the first path only (and thus to the first region of the vapor cell 221 only) during the first subset of timeslots and directing the coupling signal to the second path only (and thus to the second region of the vapor cell 221 only) during the second subset of timeslots. The RF detector 220 may therefore be configured such that the time difference between the coupling signal being directed along a particular path and subsequently being directed along that same path again is greater than the time for electrons of the Rubidium-85 atoms of the region of the vapor cell 121 contained in that path to return to the $1^{st}$ excited state (that is, the state the electrons are excited to by the probe signal in the non-interacting condition). In other words, the time difference between adjacent timeslots of the subset of timeslots allocated to a particular path is greater than the time for electrons of the Rubidium-85 atoms of the region of the vapor cell 121 contained in that path to return to the $1^{st}$ excited state. Furthermore, the coupling laser 225 power is set such that $\Omega_c^2$ is less than $\Gamma_1\Gamma_2$. Accordingly, this second embodiment also enjoys the benefit of the response time of the EIT signal being reduced relative to the scenario where the coupling signal is constantly directed to all paths.

Figure 8:
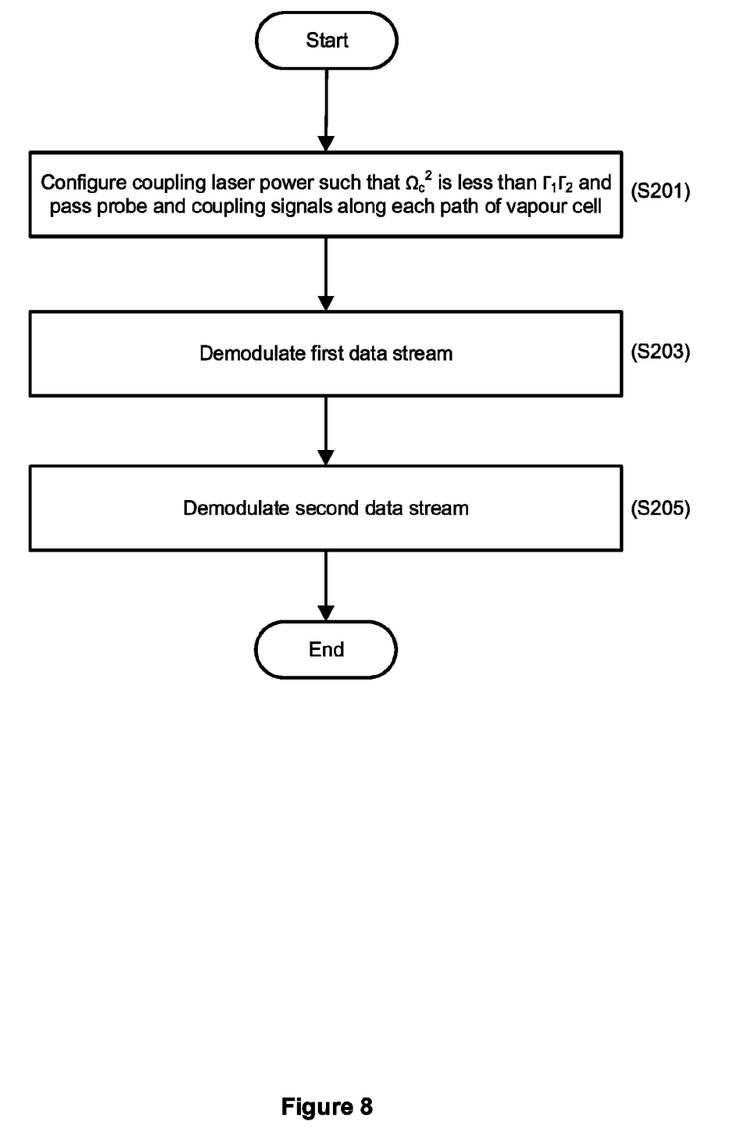
FIG. 8 is a flow diagram illustrating a second embodiment of a method of the present disclosure.

A second embodiment of a method of the present disclosure will now be described with reference to FIG. 8. This second embodiment of a method relates to the second embodiment of the wireless telecommunications network 200 described above and shown in FIG. 6. In this second embodiment, the wireless transmitter 210 is transmitting wireless signals at 2.8 GHz. Wireless signals from the wireless transmitter 210 are incident upon the vapor cell 221 of the RF detector 220.

In S201, the RF detector 220 is operated so that the probe and coupling signals pass through the vapor cell 221 and so that the time period between adjacent iterations of the interacting condition for each region of the vapor cell is equal to or greater than the time period for electrons of the Rubidium-85 atoms in that region to return to the $1^{st}$ excited state. Furthermore, a coupling laser 125 power value is configured so that $\Omega_c^2$ is less than $\Gamma_1\Gamma_2$. In S203 of this second embodiment, the processor 229 receives signals at the first photodetector 227a and demodulates these signals into a first data stream. These signals received at the first photodetector 227a are those transmitted by the wireless transmitter 210 during each timeslot of the first set of timeslots and incident upon the first region of the vapor cell 221 of the RF detector 220. In S205, the processor 229 receives signals at the second photodetector 227b and demodulates these signals into a second data stream. These signals received at the second photodetector 227b are those transmitted by the wireless transmitter 210 during each timeslot of the second set of timeslots and incident upon the second region of the vapor cell 221 of the RF detector 220. The first and second data streams may then be further processed (locally or by another entity).

In the above embodiments, the vapor cell 220 is static and the probe and coupling signals are manipulated so as to pass through different regions of the vapor cell 220 (and thus excite a different set of Rubidium-85 atoms). However, this is non-essential and there are alternative implementations which enable different sets of Rubidium-85 atoms to interact with the probe and coupling lasers. For example, the probe and coupling signals may be static, and a vapor of Rubidium-85 atoms may be configured to flow through the probe and coupling signals (such as by flowing along a glass tube). A path of the flowing vapor may be configured in a loop such that a section of the loop passes through the probe and coupling signals whilst the remainder of the loop does not pass through the probe and coupling signals.

The skilled person will understand that it is non-essential that the atomic medium of the RF detector that may be excited to the predetermined Rydberg states is contained in a vapor cell. That is, the atomic medium may be part of a hollow-core fiber segment of an optical fiber. For example, a hollow core fiber implementation of the second embodiment above may include counter propagating probe and coupling lasers that are respectively split into a plurality of optical fiber cores wherein the probe signal of each optical fiber core is directed towards a photodetector using a circulator. The plurality of optical fiber cores may be a plurality of optical fibers each having a single core or may be a plurality of cores of a single fiber. The plurality of optical fiber cores may comprise, for example, 64 cores.

Furthermore, it is non-essential that the atomic medium is comprised of Rubidium-85 atoms. Instead, the atomic medium may be comprised of any other alkali metal, such as Cesium or Strontium.

The skilled person will also understand that the above methods may be applied to many other electromagnetic signals of different frequencies. That is, for a particular target frequency, a system may be configured such that an EIT signal is produced on a probe signal by an incident electromagnetic signal at that target frequency (such as by selecting an appropriate atomic medium (e.g. Rubidium, Cesium or Strontium) having Rydberg states that correspond with that target frequency). Furthermore, it is also non-essential that the EIT signal is produced following a ladder configuration of electron transitions. That is, any configuration (e.g. Lambda, Vee) may be used.

The skilled person will understand that it is non-essential that the non-interacting condition of each region of the atomic medium excludes both the probe and coupling signals. As illustrated by the second embodiment above, the probe signal may pass through a region when that region is in the non-interacting condition. In other words, in the non-interacting condition, the region is not subject to the coupling signal but may be subject to the probe signal and, in the interacting condition, the region is subject to both the probe and coupling signals. The skilled person would understand, following review of the first and second embodiments above, that these differing implementations alter the time period between iterations of the interacting condition for any particular region. That is, in the first embodiment, a region was not subject to the probe signal during the non-interacting condition and, as such, the time period was that required for electrons of the Rubidium-85 atoms of that region to return to the ground state (the state for electrons that are not being excited). In the second embodiment, a region was subject to the probe signal during the non-interacting condition and, as such, the time period was that required for electrons of the Rubdium-85 atoms of that region to return to the $1^{st}$ excited state (the state the probe signal excites electrons to). Thus, stated generally, the time period between adjacent iterations of the interacting condition is that required for electrons of the Rubidium-85 atoms of that region to return to their state of the non-interacting condition.

Furthermore, it is non-essential that the power of the coupling laser is controlled so that $\Omega_c^2$ is less than $\Gamma_1\Gamma_2$. Alternatively or additionally, the cross-sectional area of the coupling laser may be controlled so that $\Omega_c^2$ is less than $\Gamma_1\Gamma_2$.

The skilled person will understand that any combination of features is possible within the scope of the disclosure, as claimed.

The invention claimed is:

1. A method of operating an electromagnetic field detector in a wireless telecommunications network, the electromagnetic field detector including a first optical transmitter, a second optical transmitter, and a transmission medium, wherein the first optical transmitter is configured to transmit a probe signal at a probe frequency and the second optical transmitter is configured to transmit a coupling signal at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency (EIT) effect such that an incident electromagnetic field at the transmission medium causes a detectable change in the probe signal, the method comprising:

transmitting the probe signal and the coupling signal within a plurality of interaction regions of the transmission medium such that each interaction region of the plurality of interaction regions switches between a first condition and a second condition, in which:

in the first condition of each interaction region, the probe signal and the coupling signal are transmitted within the respective interaction region, the second condition of each interaction region exists for a time period for which an effect of the coupling signal on the electrons of the transmission medium persists after a switch from the first condition to the second condition, and an intensity of the coupling signal is such that:

$$\Omega_c^2 < \Gamma_1 \Gamma_2$$

in which $\Omega_c$ is a Rabi frequency of the coupling signal, $\Gamma_1$ is a transition rate out of the first excited state of the transmission medium, and $\Gamma_2$ is a transition rate out of the predetermined excited state of the transmission medium.

2. The method as claimed in claim 1, wherein at least one of a power value or a cross-sectional area of a coupling laser is controlled so that the intensity of the coupling signal is such that $\Omega_c^2 < \Gamma_1 \Gamma_2$.

3. A non-transitory computer-readable storage medium storing a computer program comprising instructions which, when the computer program is executed by a computer, cause the computer to carry out the method of claim 1.

4. A system comprising:

at least one processor and memory storing a computer program which, when the computer program is executed by the system, causes the system to carry out the method of claim 1.

5. An electromagnetic field detector for a wireless telecommunications network, the electromagnetic field detector comprising:

a transmission medium;

an optical receiver;

a first optical transmitter configured to transmit a probe signal at a probe frequency;

a second optical transmitter configured to transmit a coupling signal at a coupling frequency, wherein the probe frequency and the coupling frequency are set to excite electrons of the transmission medium to a predetermined excited state so as to induce an Electromagnetic Induced Transparency (EIT) effect in the transmission medium such that an incident electromagnetic field at the transmission medium causes a detectable change in the probe signal at the optical receiver; and a controller configured to control a probe laser and a coupling laser so as to transmit the probe signal and the coupling signal within a plurality of interaction regions of the transmission medium such that each interaction region of the plurality of interaction regions switches between a first state and a second state, in which:

in the first state of each interaction region, the probe signal and the coupling signal are transmitted within that interaction region, the second condition of each interaction region exists for a time period for which an effect of the coupling signal on the electrons of the transmission medium persists after a switch from the first condition to the second condition, and an intensity of the coupling signal is such that:

$$\Omega_c^2 < \Gamma_1 \Gamma_2$$

in which $\Omega_c$ is a Rabi frequency of the coupling signal, $\Gamma_1$ is a transition rate out of the first excited state of the transmission medium, and $\Gamma_2$ is a transition rate out of the predetermined excited state of the transmission medium.

6. The electromagnetic field detector as claimed in claim 5, wherein the controller is configured to control at least one of a power value or a cross-sectional area of the coupling laser so that the intensity of the coupling signal is such that $\Omega_c^2 < \Gamma_1 \Gamma_2$.

7. The electromagnetic field detector as claimed in claim 5, wherein each interaction region of the plurality of interaction regions is a region of a vapor cell.

8. The electromagnetic field detector as claimed in claim 7, wherein the plurality of interaction regions span from a first side of the vapor cell to a second side of the vapor cell such that a first interaction region of the plurality of interaction regions is situated towards the first side of the vapor cell relative to a second interaction region of the plurality of interaction regions and the second interaction region is situated towards the second side of the vapor cell relative to the first interaction region, and the controller is further configured to iteratively:

transmit the probe signal and the coupling signal such that the first interaction region is in the first condition and such that the second interaction region is in the second condition, and transmit the probe signal and the coupling signal such that the first interaction region is in the second condition and such that the second interaction region is in the first condition.

9. The electromagnetic field detector as claimed in claim 5, wherein each interaction region of the plurality of interaction region is an optical fiber core.

* * * * *

UNITED STATES PATENT AND TRADEMARK OFFICE
CERTIFICATE OF CORRECTION

PATENT NO. : 12,248,011 B2
APPLICATION NO. : 18/554534
DATED : March 11, 2025
INVENTOR(S) : Fraser Burton et al.

It is certified that error appears in the above-identified patent and that said Letters Patent is hereby corrected as shown below:

On the Title Page

In item (73), in Column 1, under "Assignee", Line 2, delete "Company (GB)" and insert -- Company, London (GB) --.

On the page 2, in Column 1, under Item (56) "Other Publications", Line 13, delete "al. ," and insert -- al., --.

On the page 2, in Column 1, under Item (56) "Other Publications", Line 15, delete "Detection" ," and insert -- Detection", --.

On the page 2, in Column 1, under Item (56) "Other Publications", Line 16, delete "1910.07970v1> ," and insert -- 1910.07970v1>, --.

On the page 2, in Column 1, under Item (56) "Other Publications", Line 16, delete "2019 ," and insert -- 2019, --.

On the page 2, in Column 1, under Item (56) "Other Publications", Line 17, delete "Hollowa," and insert -- Holloway, --.

On the page 2, in Column 1, under Item (56) "Other Publications", Line 17, delete "al. ," and insert -- al., --.

On the page 2, in Column 1, under Item (56) "Other Publications", Line 18, delete "Receiver" ," and insert -- Receiver", --.

On the page 2, in Column 2, under Item (56) "Other Publications", Line 1, delete "al. ," and insert -- al., --.

Signed and Sealed this
Twenty-seventh Day of May, 2025

Coke Morgan Stewart
*Acting Director of the United States Patent and Trademark Office*

CERTIFICATE OF CORRECTION (continued)
U.S. Pat. No. 12,248,011 B2

On the page 2, in Column 2, under Item (56) "Other Publications", Line 3, delete "Vapor" ," and insert -- Vapor", --.

On the page 2, in Column 2, under Item (56) "Other Publications", Line 4, delete "233106 ," and insert -- 233106, --.

On the page 2, in Column 2, under Item (56) "Other Publications", Line 6, delete "Readout" ," and insert -- Readout", --.

On the page 2, in Column 2, under Item (56) "Other Publications", Line 8, delete "srep42981.pdf> ," and insert -- srep42981.pdf>, --.

On the page 2, in Column 2, under Item (56) "Other Publications", Line 8, delete "2017 ," and insert -- 2017, --.

On the page 2, in Column 2, under Item (56) "Other Publications", Lines 10-11, delete "13 ," and insert -- 13, --.

On the page 2, in Column 2, under Item (56) "Other Publications", Line 11, delete "1995 ," and insert -- 1995, --.

On the page 2, in Column 2, under Item (56) "Other Publications", Line 13, delete "Fields" ," and insert -- Fields", --.

On the page 2, in Column 2, under Item (56) "Other Publications", Line 14, delete "1803.03545v2> ," and insert -- 1803.03545v2>, --.

On the page 2, in Column 2, under Item (56) "Other Publications", Line 15, delete "2018 ," and insert -- 2018, --.

On the page 2, in Column 2, under Item (56) "Other Publications", Line 18, delete "2102.05285v1> ," and insert -- 2102.05285v1>, --.

On the page 2, in Column 2, under Item (56) "Other Publications", Line 19, delete "2021 ," and insert -- 2021, --.

On the page 2, in Column 2, under Item (56) "Other Publications", Line 21, delete "Sensor" ," and insert -- Sensor", --.

On the page 2, in Column 2, under Item (56) "Other Publications", Line 23, delete "2021 ," and insert -- 2021, --.

On the page 2, in Column 2, under Item (56) "Other Publications", Line 26, delete "Carrier" ," and insert -- Carrier", --.

CERTIFICATE OF CORRECTION (continued)
U.S. Pat. No. 12,248,011 B2

On the page 2, in Column 2, under Item (56) "Other Publications", Line 29, delete "Analogs" ," and insert -- Analogs", --.

On the page 2, in Column 2, under Item (56) "Other Publications", Line 30, delete "1408.1024v4> ," and insert -- 1408.1024v4>, --.

On the page 2, in Column 2, under Item (56) "Other Publications", Line 32, delete "Rubidium" ," and insert -- Rubidium", --.

On the page 2, in Column 2, under Item (56) "Other Publications", Line 33, delete "4 ," and insert -- 4, --.

On the page 2, in Column 2, under Item (56) "Other Publications", Line 38, delete "Yang ," and insert -- Yang, --.

On the page 2, in Column 2, under Item (56) "Other Publications", Line 41, delete "Lan ," and insert -- Lan, --.

On the page 2, in Column 2, under Item (56) "Other Publications", Line 43, delete "Lvovsky ," and insert -- Lvovsky, --.

On the page 2, in Column 2, under Item (56) "Other Publications", Line 45, delete "Zhang ," and insert -- Zhang, --.

In the Drawings

On sheet 4 of 8, in Figure 4, and on the Title Page, the illustrative print figure, Line 1 (Reference numeral (S103)), delete "though" and insert -- through --.

On sheet 5 of 8, in Figure 5, Line 1, delete "Modulation/ dB" and insert -- Modulation/dB --.

In the Specification

In Column 3, Line 18, delete "Aa" and insert -- A --.

In Column 5, Line 10 (Approx.), before "passes" delete "is".

In Column 5, Line 17 (Approx.), delete "though" and insert -- through --.

In Column 7, Line 61, delete "laser," and insert -- laser. --.

In Column 7, Line 66 (Approx.), delete "/$\{\Gamma_1\Gamma_2\Gamma_3+\Omega_r^2)X_1+$" and insert -- /$\{\Gamma_1(\Gamma_2\Gamma_3+\Omega_r^2)X_1+$ --.

In Column 8, Line 10 (Approx.), delete "/$\{\Gamma_1\Gamma_2\Gamma_3+\Omega_r^2)X_1+\Gamma_3\Omega_c^2\}$" and insert -- /$\{\Gamma_1(\Gamma_2\Gamma_3+\Omega_r^2)X_1+\Gamma_3\Omega_c^2\}$ --.

CERTIFICATE OF CORRECTION (continued)
U.S. Pat. No. 12,248,011 B2

In Column 9, Line 6, delete "rate u." and insert -- rate $\alpha$. --.

In Column 9, Line 61, delete "Rubidum-85" and insert -- Rubidium-85 --.

In Column 10, Line 13, delete "Rubdium-85" and insert -- Rubidium-85 --.

In Column 10, Line 25, delete "rate u." and insert -- rate $\alpha$. --.

In Column 10, Line 59, delete "Rubidum-85" and insert -- Rubidium-85 --.

In Column 11, Line 7, delete "Fi)." and insert -- $\Gamma_1$). --.

In Column 14, Line 56, delete "Rubdium-85" and insert -- Rubidium-85 --.